(12) United States Patent
Hassan et al.

(10) Patent No.: US 11,086,719 B2
(45) Date of Patent: Aug. 10, 2021

(54) USE OF ERROR CORRECTION CODES TO PREVENT ERRORS IN NEIGHBORING STORAGE

(71) Applicant: Microsoft Technology Licensing, LLC, Redmond, WA (US)

(72) Inventors: Amer Aref Hassan, Kirkland, WA (US); Roy D. Kuntz, Kirkland, WA (US); David Anthony Lickorish, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/512,802

(22) Filed: Jul. 16, 2019

(65) Prior Publication Data

US 2021/0019226 A1    Jan. 21, 2021

(51) Int. Cl.
*G11C 16/34* (2006.01)
*G06F 11/10* (2006.01)
(Continued)

(52) U.S. Cl.
CPC ........ *G06F 11/1076* (2013.01); *G06F 3/0604* (2013.01); *G06F 3/0659* (2013.01);
(Continued)

(58) Field of Classification Search
CPC .. G06F 11/1076; G06F 3/0604; G06F 3/0659; G06F 3/0673; G06F 11/1048;
(Continued)

(56) References Cited

U.S. PATENT DOCUMENTS

| 5,179,592 A | 1/1993 | Kusano |
| 5,604,766 A | 2/1997 | Dohi et al. |

(Continued)

FOREIGN PATENT DOCUMENTS

| CN | 101681284 B | 1/2013 |
| EP | 1416659 A1 | 5/2004 |

(Continued)

OTHER PUBLICATIONS

U.S. Appl. No. 16/512,668, filed Jul. 16, 2019, Peak to Average Power Output Reduction of RF Systems Utilizing Error Correction.

(Continued)

*Primary Examiner* — Albert Decady
*Assistant Examiner* — Enam Ahmed
(74) *Attorney, Agent, or Firm* — Schwegman Lundberg & Woessner, P.A.

(57) ABSTRACT

Disclosed in some examples are methods, systems, storage devices, and machine readable mediums that utilize the ability of ECC to correct errors to actively prevent errors. The memory device determines whether a request to place data of a requested value at a requested location in the storage media is likely to interfere with other data stored at other locations on the storage media, and if so, changes the requested value to a second value that will not interfere (or has a lower probability of interfering) with neighboring data. The second value may be corrected to the requested value when a read request is made for that data using ECC.

17 Claims, 5 Drawing Sheets

(51) Int. Cl.
*G06F 3/06* (2006.01)
*G11B 5/012* (2006.01)
*G11C 16/04* (2006.01)
*G11C 16/10* (2006.01)
*G11C 16/26* (2006.01)

(52) U.S. Cl.
CPC ............ *G06F 3/0673* (2013.01); *G11B 5/012* (2013.01); *G11C 16/0483* (2013.01); *G11C 16/10* (2013.01); *G11C 16/26* (2013.01); *G11C 16/3427* (2013.01)

(58) Field of Classification Search
CPC ..... G11C 16/10; G11C 16/3427; G11C 16/26; G11C 16/0483; G11C 2029/0409; G11C 2029/0411; G11C 29/52; G11C 11/1675; G11B 5/012
USPC ........................................................ 714/764
See application file for complete search history.

(56) References Cited

U.S. PATENT DOCUMENTS

| | | | |
|---|---|---|---|
| 5,944,851 | A | 8/1999 | Lee |
| 6,134,274 | A | 10/2000 | Sankaranarayanan et al. |
| 6,158,041 | A | 12/2000 | Raleigh et al. |
| 6,421,357 | B1 | 7/2002 | Hall |
| 6,430,230 | B1 | 8/2002 | Cunningham et al. |
| 6,757,299 | B1 | 6/2004 | Verma |
| 6,934,317 | B1 | 8/2005 | Dent |
| 7,032,238 | B2 | 4/2006 | Parnell et al. |
| 7,113,708 | B1 | 9/2006 | Creaney et al. |
| 7,139,322 | B1 | 11/2006 | Nergis |
| 7,191,381 | B2 | 3/2007 | Gesbert et al. |
| 7,215,721 | B2 | 5/2007 | Hietala et al. |
| 7,292,639 | B1 | 11/2007 | Demirekler et al. |
| 7,580,630 | B2 | 8/2009 | Kee et al. |
| 7,599,338 | B2 | 10/2009 | Sari |
| 7,647,037 | B2 | 1/2010 | Ayachitula et al. |
| 7,668,248 | B2 | 2/2010 | Hocevar |
| 7,768,934 | B2 | 8/2010 | Yamanaka et al. |
| 7,792,200 | B2 | 9/2010 | Molander |
| 7,986,783 | B2 | 7/2011 | Ikushima et al. |
| 8,059,697 | B2 | 11/2011 | Dent |
| 8,078,942 | B2 * | 12/2011 | Jordan .................... G06F 11/10 714/773 |
| 8,155,175 | B2 | 4/2012 | Olgaard |
| 8,189,407 | B2 | 5/2012 | Strasser et al. |
| 8,189,711 | B2 | 5/2012 | Shimizu |
| 8,270,525 | B2 | 9/2012 | Nakagawa et al. |
| 8,401,102 | B2 | 3/2013 | Tsouri et al. |
| 8,422,589 | B2 | 4/2013 | Golitschek Edler Von Elbwart et al. |
| 8,446,811 | B2 | 5/2013 | Yue et al. |
| 8,484,518 | B2 | 7/2013 | Weeber |
| 8,494,087 | B2 | 7/2013 | Seyedi-Esfahani |
| 8,509,259 | B2 | 8/2013 | Powell |
| 8,559,378 | B2 | 10/2013 | Schaepperle |
| 8,842,761 | B2 | 9/2014 | Barsoum et al. |
| 9,071,306 | B2 | 6/2015 | Kohda et al. |
| 9,094,151 | B2 | 7/2015 | Perez De Aranda Alonso et al. |
| 9,176,810 | B2 | 11/2015 | Peterson et al. |
| 9,276,680 | B2 | 3/2016 | Valencia et al. |
| 9,386,587 | B2 | 7/2016 | Hu et al. |
| 9,444,669 | B2 | 9/2016 | Brecher et al. |
| 9,467,229 | B2 | 10/2016 | Kai et al. |
| 9,608,733 | B2 | 3/2017 | Pavlas et al. |
| 9,614,644 | B2 | 4/2017 | Jeong et al. |
| 9,766,972 | B2 | 9/2017 | Davis et al. |
| 9,792,176 | B2 | 10/2017 | Blaichman et al. |
| 9,806,739 | B1 | 10/2017 | Kojima et al. |
| 9,818,136 | B1 | 11/2017 | Hoffberg |
| 9,859,977 | B2 | 1/2018 | Zhao et al. |
| 10,015,028 | B2 | 7/2018 | Jorgensen et al. |
| 10,084,631 | B2 | 9/2018 | Raphaeli et al. |
| 10,230,468 | B2 | 3/2019 | Mansouri Rad et al. |
| 10,333,617 | B2 | 6/2019 | Moision et al. |
| 10,333,622 | B2 | 6/2019 | Bhoja et al. |
| 10,686,530 | B1 | 6/2020 | Hassan |
| 2002/0016945 | A1 | 2/2002 | Sayood et al. |
| 2003/0076569 | A1 | 4/2003 | Stevens |
| 2003/0099302 | A1 | 5/2003 | Tong et al. |
| 2004/0123224 | A1 | 6/2004 | Colombo et al. |
| 2005/0047517 | A1 | 3/2005 | Georgios et al. |
| 2005/0157780 | A1 | 7/2005 | Werner et al. |
| 2005/0207754 | A1 | 9/2005 | Yamaguchi et al. |
| 2006/0098747 | A1 | 5/2006 | Yue et al. |
| 2006/0203765 | A1 | 9/2006 | Laroia et al. |
| 2007/0014286 | A1 | 1/2007 | Lai |
| 2007/0098094 | A1 | 5/2007 | Yue et al. |
| 2007/0195589 | A1* | 8/2007 | Hidaka .................... G11C 11/16 365/158 |
| 2008/0055979 | A1* | 3/2008 | Shim .................... G11C 16/3422 365/185.02 |
| 2008/0082736 | A1 | 4/2008 | Chow et al. |
| 2008/0299984 | A1 | 12/2008 | Shimomura et al. |
| 2009/0022241 | A1 | 1/2009 | Fukuoka et al. |
| 2009/0080556 | A1 | 3/2009 | Duan et al. |
| 2009/0092072 | A1 | 4/2009 | Imamura et al. |
| 2009/0148058 | A1 | 6/2009 | Dane et al. |
| 2009/0300460 | A1 | 12/2009 | Yoshii et al. |
| 2009/0313519 | A1 | 12/2009 | Nagaraja |
| 2010/0008214 | A1 | 1/2010 | Siaud et al. |
| 2010/0034186 | A1 | 2/2010 | Zhou et al. |
| 2010/0050050 | A1 | 2/2010 | Nishi |
| 2010/0182294 | A1 | 7/2010 | Roshan et al. |
| 2010/0223530 | A1 | 9/2010 | Son et al. |
| 2010/0226449 | A1 | 9/2010 | Ilow et al. |
| 2010/0293440 | A1* | 11/2010 | Thatcher ............ G06F 11/1092 714/764 |
| 2010/0303004 | A1 | 12/2010 | Mueck et al. |
| 2011/0029845 | A1 | 2/2011 | Zhou et al. |
| 2011/0066902 | A1 | 3/2011 | Sharon et al. |
| 2011/0131468 | A1 | 6/2011 | Myers et al. |
| 2012/0060069 | A1 | 3/2012 | Yu et al. |
| 2012/0128367 | A1 | 5/2012 | Yamada |
| 2012/0155354 | A1 | 6/2012 | Kishigami et al. |
| 2013/0202001 | A1 | 8/2013 | Zhang |
| 2013/0238955 | A1 | 9/2013 | D'abreu et al. |
| 2013/0343473 | A1 | 12/2013 | Eliaz et al. |
| 2014/0043069 | A1 | 2/2014 | Oh et al. |
| 2014/0072068 | A1 | 3/2014 | Zhu et al. |
| 2014/0086575 | A1 | 3/2014 | Fukushi |
| 2014/0281121 | A1* | 9/2014 | Karamcheti .......... G06F 9/4881 711/102 |
| 2014/0334421 | A1 | 11/2014 | Sosa et al. |
| 2014/0362934 | A1 | 12/2014 | Kumar |
| 2014/0376663 | A1 | 12/2014 | Ko et al. |
| 2015/0049844 | A1 | 2/2015 | Stott |
| 2015/0058499 | A1* | 2/2015 | Gibbons ................ G06F 3/068 710/14 |
| 2015/0085748 | A1 | 3/2015 | Jorgensen et al. |
| 2015/0092881 | A1 | 4/2015 | Hwang et al. |
| 2015/0117227 | A1 | 4/2015 | Zhang et al. |
| 2015/0117433 | A1 | 4/2015 | Zhang et al. |
| 2015/0193302 | A1* | 7/2015 | Hyun .................... G06F 11/108 714/764 |
| 2015/0205664 | A1* | 7/2015 | Janik .................... G06F 11/1012 714/764 |
| 2016/0028514 | A1 | 1/2016 | Venkataraghavan et al. |
| 2016/0042797 | A1* | 2/2016 | Kim ..................... G11C 29/028 714/764 |
| 2016/0127091 | A1 | 5/2016 | Yan et al. |
| 2016/0239796 | A1 | 8/2016 | Grant et al. |
| 2016/0241682 | A1 | 8/2016 | Xu et al. |
| 2016/0315733 | A1 | 10/2016 | Murakami et al. |
| 2016/0350187 | A1 | 12/2016 | Saliba |
| 2017/0063466 | A1 | 3/2017 | Wang et al. |
| 2017/0141798 | A1 | 5/2017 | Kudekar et al. |
| 2017/0180055 | A1 | 6/2017 | Yu et al. |
| 2017/0220415 | A1* | 8/2017 | Hashimoto .......... G06F 3/064 |
| 2018/0103382 | A1 | 4/2018 | Hassan et al. |
| 2018/0123840 | A1 | 5/2018 | Dmitriev-zdorov |

(56) References Cited

U.S. PATENT DOCUMENTS

| | | |
|---|---|---|
| 2018/0183516 A1 | 6/2018 | Moision et al. |
| 2018/0337816 A1 | 11/2018 | Herath et al. |
| 2019/0052505 A1 | 2/2019 | Baldemair et al. |
| 2019/0121417 A1 | 4/2019 | Schneider et al. |
| 2019/0149265 A1 | 5/2019 | Das Sharma |
| 2019/0214852 A1 | 7/2019 | Park |
| 2019/0235793 A1* | 8/2019 | Aikawa .............. G06F 3/0659 |
| 2019/0260394 A1 | 8/2019 | Motwani et al. |
| 2019/0312694 A1 | 10/2019 | Jia et al. |
| 2020/0186189 A1 | 6/2020 | Herath et al. |

FOREIGN PATENT DOCUMENTS

| | | |
|---|---|---|
| JP | 2009535924 A | 10/2009 |
| JP | 2011135161 A | 7/2011 |
| KR | 20140037313 A | 3/2014 |
| WO | 0228041 A3 | 10/2002 |
| WO | 2007066973 A2 | 6/2007 |
| WO | 2008046163 A1 | 4/2008 |
| WO | 2008095334 A1 | 8/2008 |
| WO | 2009003278 A1 | 1/2009 |
| WO | 2013086311 A1 | 6/2013 |
| WO | 2019047162 A1 | 3/2019 |

OTHER PUBLICATIONS

U.S. Appl. No. 16/526,496, filed Jul. 30, 2019, Dynamically Selecting a Channel Model for Optical Communications.

U.S. Appl. No. 16/512,709, filed Jul. 16, 2019, Smart Symbol Changes for Optimization of Communications Using Error Correction.

U.S. Appl. No. 16/512,738, filed Jul. 16, 2019, Peak to Average Power Ratio Reduction of Optical Systems Utilizing Error Correction.

U.S. Appl. No. 16/513,101, filed Jul. 16, 2019, Intelligent Optimization of Communication Systems Utilizing Error Correction.

U.S. Appl. No. 16/513,159, filed Jul. 16, 2019, Increasing Average Power Levels to Reduce Peak-to-Average Power Levels Using Error Correction Codes.

U.S. Appl. No. 16/512,786, filed Jul. 16, 2019, Bit Error Reduction of Communication Systems Using Error Correction.

"Application as Filed in U.S. Appl. No. 16/388,373", filed Apr. 18, 2019, 92 Pages.

"Ex-Parte Quayle Action Issued in U.S. Appl. No. 16/513,101", dated Mar. 6, 2020, 06 Pages.

"Notice of Allowance Issued in U.S. Appl. No. 16/526,496", dated Mar. 30, 2020, 11 Pages.

Ali, et al., "Peak-to-Average Power Ratio Reduction Using N-tuple Selective Mapping Method for MC-CDMA", In Journal of ETRI, vol. 37, Issue 2, Apr. 2, 2015, pp. 338-347.

Dash, et al., "Constellation Modulation—An Approach to Increase Spectral Efficiency", In Journal of Optics Express, vol. 25, Issue 14, Jul. 10, 2017, 22 Pages.

Feng, et al., "Digital Domain Power Division Multiplexing DDO-OFDM Transmission with Successive Interference Cancellation", In Proceedings of Conference on Lasers and Electro-Optics, Jun. 5, 2016, 2 Pages.

Sharma, et al., "Bit Error Rate Improvement by using Active Constellation Extension and Neural Network in OFDM System", In Journal of Network Communications and Emerging Technologies, vol. 6, Issue 3, Mar. 2016, pp. 33-36.

Taher, et al., "Reducing the PAPR of OFDM Systems by Random Variable Transformation", In Journal of ETRI, vol. 35, Issue 4, Aug. 30, 2013, pp. 714-717.

Wu, et al., "A New Constellation Diagram-Based Signal Detection for GSM-MIMO Systems", In Journal of IEEE Communications Letters, vol. 22, Issue 3, Mar. 2018, pp. 502-505.

Wu, et al., "Digital Domain Power Division Multiplexed Dual Polarization Coherent Optical OFDM Transmission", In Journal of Scientific Reports, vol. 8, No. 1, Oct. 25, 2018, 8 Pages.

"Non Final Office Action Issued in U.S. Appl. No. 16/512,668", dated May 18, 2020, 8 Pages.

Urban, et al., "OFDM PAPR Reduction by Combination of Interleaving with Repeated Clipping and Filtering", In Proceedings of the 17th International Conference Radioelektronika, Jun. 1, 2007, pp. 249-252.

Jamieson, et al., "SPCpl-04: Bit Mapping and Error Insertion for FEC Based PAPR Reduction in OFDM Signals", In IEEE Globecom, Nov. 1, 2007, 5 Pages.

Liu, et al., "Deliberate Bit Flipping With Error-Correction for PAPR Reduction", In IEEE Transactions on Broadcasting vol. 63, Issue 1, Mar. 1, 2017, pp. 123-133.

"International Search Report & Written Opinion issued in PCT Application No. PCT/US2020/033888", dated Jul. 31, 2020, 12 Pages.

"International Search Report and Written Opinion Issued in PCT Application No. PCT/US2020/033014", dated Aug. 18, 2020, 13 Pages.

"International Search Report and Written Opinion Issued in PCT Application No. PCT/US2020/033348", dated Aug. 24, 2020, 13 Pages.

"International Search Report and Written Opinion Issued in PCT Application No. PCT/US2020/033503", dated Aug. 18, 2020, 12 Pages.

"International Search Report and Written Opinion Issued in PCT Application No. PCT/US2020/033501", dated Aug. 25, 2020, 12 Pages.

"International Search Report and Written Opinion Issued in PCT Application No. PCT/US2020/034586", dated Sep. 8, 2020, 13 Pages.

"International Search Report and Written Opinion Issued in PCT Application No. PCT/US2020/033012", dated Aug. 20, 2020, 12 Pages.

"Final Office Action Issued in U.S. Appl. No. 16/512,668", dated Aug. 28, 2020, 9 Pages.

"Notice of Allowance Issued in U.S. Appl. No. 16/512,709", dated Dec. 10, 2020, 9 Pages.

"Notice of Allowance Issued in U.S. Appl. No. 16/526,496", dated Jul. 14, 2020, 7 Pages.

"Non-Final Office Action Issued in U.S. Appl. No. 16/512,709", dated Jul. 21, 2020, 17 Pages.

"Non Final Office Action Issued in U.S. Appl. No. 16/512,786", dated Aug. 6, 2020, 6 Pages.

"International Search Report and Written Opinion Issued in PCT Application No. PCT/US20/036867", dated Oct. 7, 2020, 10 Pages.

"Non Final Office Action Issued in U.S. Appl. No. 16/513,159", dated Oct. 29, 2020, 12 Pages.

"Notice of Allowance Isssued in U.S. Appl. No. 16/512,738", dated Mar. 16, 2021, 19 Pages.

Alkady, et al., "Peak-to-Average Power ratio using Adaptive Subcarrier Phase Adjustment Algorithm for OFDM-based Cognitive Radio", In proceedings of Wireless Personal Communications, vol. 80, Issue 4, Feb. 2015, pp. 1535-1546.

"Non Final Office Action Issued in U.S. Appl. No. 16/512,738", dated Nov. 10, 2020, 40 Pages.

Wang, et al., "Low-Complexity Peak-to-Average Power Ratio Reduction Method for Orthogonal Frequency-Division Multiplexing Communications", In Journal of IET Communications vol. 9 Issue 17, Nov. 26, 2015, 7 Pages.

* cited by examiner

USE OF ERROR CORRECTION CODES TO PREVENT ERRORS IN NEIGHBORING STORAGE

BACKGROUND

Magnetic storage devices encode bits as a directional alignment of magnetic charges on a magnetic media. For example, a hard disk utilizes one or more spinning platters of metal with magnetic particles affixed to them. To write data, a write head moves to a specific location of one of the spinning platters and electrical current is applied to an electromagnet of the write head which generates a magnetic field which aligns the magnetic charges of the magnetic particles in that location along a certain direction. A first alignment direction may encode a '1' and a second alignment direction may encode a '0'. Later, to read the data, a read head reads the alignment direction of the magnetic charges to determine the stored bit. Magnetic storage devices typically store data in concentric rings called tracks. Portions of tracks are called sectors. Depending on the data storage device, sectors may store 512 bytes, 2048 bytes, 4096 bytes, and the like.

Solid state flash memory devices, such as NAND memory devices, store data as charges in semiconductor floating gate transistors. Charges are stored on individual semiconductor cells by applying a programming voltage to these cells. Different charge levels are assigned to different bit values or bit value combinations. In a Single Level Cell (SLC)—which stores only one bit per cell—a first charge level represents a '1' and a second charge level may represent a '0'. In a multi-level cell (MLC), two bits may be stored by use of four different charge levels. In a triple level cell (TLC), three bits may be stored by using eight charge levels, and so on.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
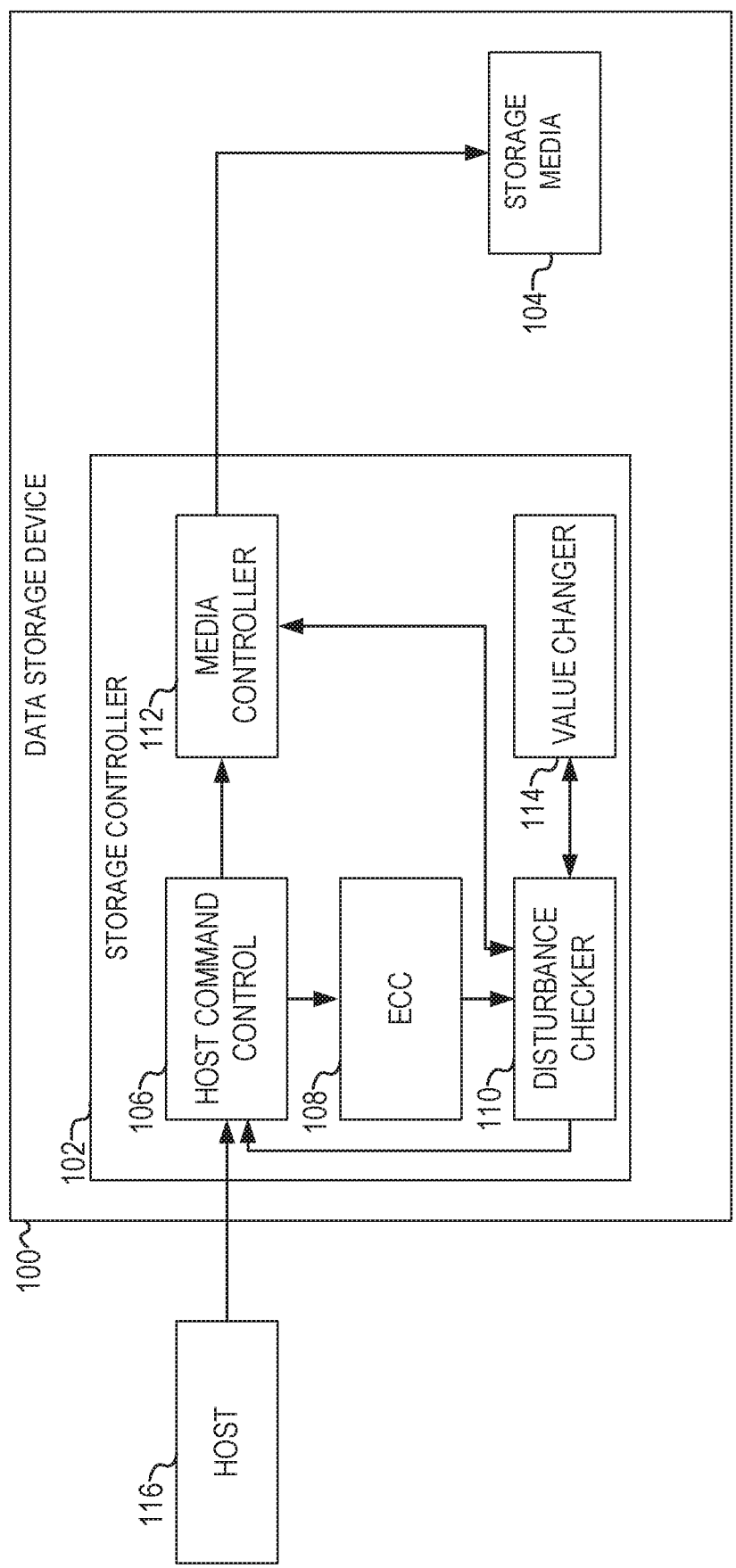
FIG. 1 illustrates a data storage device according to some examples of the present disclosure.

While magnetic and solid-state storage technologies have much different structures and methods of operation, they both rely upon the encoding of data as electrons or magnetic charge to represent the 1's and 0's of data. Both electrons stored in a semiconductor and magnetic charge stored on a magnetic medium are subject to interference. For example, a magnetic hard drive has a plurality of circular tracks that each have a plurality of sectors. To meet the demand for increased storage, hard drives have increased the density of the tracks, sectors, and the like. By reducing the size of the magnetic grains that store the magnetic charge the hard drive can store more data. As the charges becomes closer and closer together, the magnetic charge becomes more susceptible to spontaneous switching of its state of magnetization. This susceptibility increases with increases in temperature. In some examples, to solve this problem, some hard drives store their charge perpendicularly—that is, the magnetic grains are perpendicularly oriented to the plane of the media. In these devices, problems still exist where a long run length of a same value can cause a demagnetization field that causes a self-demagnetization force that tries to switch back a magnetization state of the grains within the region. These problems may affect multiple neighboring sectors.

Similarly, for solid state devices, the structure of NAND devices into word lines, pages, and blocks creates certain challenges. In NAND flash, memory cells are organized into two dimensional arrays called blocks. In each block, cells in a same row share a wordline and cells in a same column share a bitline. A page is the smallest data unit that may be programmed and read and is made up of cells connected on a same wordline. To write data to a NAND cell, a programming voltage is applied to the cell and this voltage increases the charge level to the desired range that represents the value being stored. This programming voltage may cause cell-to-cell program interference to adjacent memory cells that are not being programmed because charge from this programming voltage increases the charge level in those neighboring cells due to the interconnections of the cells. This effect is called program-disturb. If the cumulative effect of many programming voltages being applied to neighboring cells increases the charge level enough, it may change the value stored in the cell. For MLC, TLC and other cells, each cell is programmed using multiple steps to reduce the impact of this interference. Despite the use of multiple steps, programming interference is still an issue in modern NAND devices.

To read a page of NAND flash, a read voltage is applied to the wordline that contains the data to be read and sense amplifiers connected to the bitlines determine the value in the cell. To read MLC and TLC cells, multiple read voltages of different threshold voltage levels may be applied. A passthrough voltage is applied to cells of other wordlines connected to the same bitlines that are being read. The passthrough voltage is not as high as the programming voltage, but still induces a weak programming effect on those cells. This is called read-disturb. As with the program disturb, enough cumulative read-disturb incidents may cause a change in the value of a cell.

Both storage device types rely upon a number of mechanisms to deal with the errors mentioned above. For example, some NAND devices track the number of reads and writes that impact a cell as a read-disturb counter and a program-disturb counter. Each time a neighboring cell is read, the read-disturb counter for that cell is incremented. Similarly, each time a neighboring cell is programmed, the program-disturb counter may be incremented. Various actions may be taken when the read and/or program-disturb counter exceeds a threshold to ensure that the data is not compromised. For example, the data may be read and rewritten in a different cell.

Both flash memory and magnetic storage typically also use error correction codes (ECC) to detect, and correct errors caused by the mechanisms described above and other errors. Error correction codes may detect and correct a defined number of errors for a particular number of bits stored in the memory devices. The ECC is applied to the data prior to it being written to the storage medium and one or more ECC values may also be stored on the storage medium. If the errors caused by the mechanisms noted above are too numerous, they may exceed the ability of the ECC to correct the errors and the data may be irretrievably lost. For example, if the read-disturb errors change too many bits, the ECC may not be able to detect and/or correct the errors. Example ECC algorithms include block codes (e.g., Hamming codes), cyclic codes, BCH (Bose-Chaudhri-Hocquenghem) codes, Reed-Solomon codes, Convolutional codes (including Viterbi codes), and the like. ECC algorithms may include Forward Error Correction (FEC). While ECC algorithms are traditionally used to correct errors after they occur, they have not been used to actively prevent errors.

Disclosed in some examples are methods, systems, storage devices, and machine readable mediums that utilize the ability of ECC to correct errors to actively prevent errors. The memory device determines whether a request to place data of a requested value at a requested location in the storage media is likely to interfere with other data stored at other locations on the storage media, and if so, changes the requested value to a second value that will not interfere (or has a lower probability of interfering) with neighboring data. The second value may be corrected to the requested value when a read request is made for that data using ECC. That is, the ECC information may be generated on the requested value and the second value (which is actually stored) may be later corrected to the requested value using the ECC information. The second value may be chosen to be less destructive and/or interfering to neighboring data while at the same time, being close enough to the requested value to be correctable by the ECC. While intentionally introducing an error to reduce errors may seem counterintuitive, introducing a single correctable error to reduce the probability of multiple errors or one or more uncorrectable errors may reduce an overall error rate. As used herein, a data storage unit is a storage location on a physical media for a single unit of data. For example, a sector on a magnetic media, or a page on flash memory, or the like. While the techniques described herein are described as applying to a unit of data, it will be appreciated by one of ordinary skill that the techniques may be applied to smaller units of storage, such as a single NAND cell, or a location where a single bit is stored on magnetic media.

Turning now to FIG. 1 a data storage device 100 is shown according to some examples of the present disclosure. Data storage device 100 may be a magnetic memory storage device, a FLASH memory storage device (including a NAND or NOR storage device), or some combination. Data storage device 100 may comprise a storage controller 102 and storage media 104. Storage controller 102 may perform one or more management actions to manage the storage media 104. For example, address translation that translates an address (e.g., a logical address) given in a read or write command from a host 116 to a physical address on the storage media 104. For example, the storage controller 102 may include a flash translation layer that maps logical addresses to physical cells on the storage media 104. Storage controller 102 may also handle tasks such as garbage collection, wear levelling, encryption, defragmentation, and other tasks. Storage media 104 may include the physical storage media, such as NAND cells, NOR cells, magnetic media, and the like.

In addition to the functions described above, storage controller 102 may perform one or more additional operations, including changing a value to be written to the storage media 104 if storage of the proposed value at the proposed location has a probability greater than a threshold of damaging other data on the storage media. As used herein, proposed value and proposed location is the value and location specified by the host (e.g., the operating system or other application) in a write request issued to the data storage device 100. For example, the storage controller 102 may include a host command control 106 which may receive commands from a host 116—e.g., across a host interface (e.g., a Peripheral Component Interconnect Express—PCIE). Host 116 may send commands such as read, write, erase, and other commands to the storage controller 102 to perform operations on storage media 104. Host command control 106 may perform those commands and return a result to the host 116. For example, host 116 may send a write command with a proposed data value and a proposed address. Upon receiving the write command, host command control 106 may translate the proposed address to a physical address on the storage media 104. The host command control 106 may apply an ECC operation to the proposed data value by sending the data to ECC component 108. While FIG. 1 shows ECC component 108 as part of the storage controller 102, in other examples, ECC component 108 may be a separate processor. ECC component 108 may return the data to the host command control 106 along with any ECC information needed.

The host command control 106 may pass the returned ECC encoded proposed data value along with the physical address of the proposed location to a disturbance checker component 110. Disturbance checker component 110 may check to determine whether storage of the ECC encoded proposed value at the proposed location will cause interference to any non-targeted data storage units.

For solid state devices, in some examples, the disturbance checker component 110 may track the number of read disturbs and/or program disturbs that have been experienced by each cell in the storage media 104. In some examples, this may be inefficient and so the disturbance checker component 110 may track these metrics on a higher level—such as at a data storage unit level, such as a page, sub-block, block, superblock, or other organizational level. The disturbance checker component 110 may determine the data storage units that are to be programmed (target data units) and determine a set of one or more other non-target data storage units that are likely to experience read and/or write disturb effects when a particular data storage unit is programmed. The disturbance checker component 110 may determine whether incrementing the read and/or program disturb counter for each particular non-target data storage unit puts any of the non-target data storage unit at risk by comparing the counter to one or more thresholds. For example, a first threshold may correspond to a first probability, a second threshold may correspond to a second probability, and so on. In other examples, the counters may be input to a formula that determines a probability that a non-target data storage unit would be impacted by writing the requested data.

For magnetic devices such as hard disk drives, the disturbance checker may compare the proposed data to be stored and the non-target data storage units to a pattern. For example, certain patterns may tend to produce higher probabilities of interference, for example, by creating large magnetic fields. These patterns may be stored in a working memory of the memory device or on the storage media 104 itself.

For either magnetic storage devices or flash devices, certain repeated sequences of data (e.g., runs of '0's or '1's) may cause interference. In these examples, the proposed value and the values stored in non-target data storage units may be examined to determine whether a density of a particular value is over a threshold, or whether a pattern of data matches stored patterns of data that have historically caused problems.

In still other examples, a machine learning model may be utilized that predicts a probability of interference based upon the value to be stored and information about the non-target data storage units (e.g., neighboring memory pages, sectors, etc. . . . ). The information about the non-target data storage units may include the value stored in the storage unit, the location of the non-target storage unit in relation to the location of the programmed storage unit and the value to be stored, and metadata about the non-target storage unit (e.g., read disturb and/or write disturb count, number of erasures, etc. . . . ) and information about the programmed storage unit. More information on the machine learning model is discussed in relation to FIG. 4.

Non-target data units are data units that are not being programmed or written by the requested write command. Target data units are data units that are being programmed or written by the requested write command. The system may analyze all non-target data units for interference potential, or only a subset of non-target data units that are neighboring data units. Neighboring data units may be determined by the structure of the storage media 104. For example, neighboring data units may be non-target data units that are electrically or magnetically proximate to the target data units such that application of a charge or a current to, or storage of a value in, the target data unit may cause interference to the non-target data units.

If the disturbance checker component 110 determines that there exists a probability that writing this value to the selected location may cause other data storage units to be interfered with, the disturbance checker component 110 may determine a new value to store. In some examples, the probability may be a probability of affecting a single non-target data unit that is over a specified threshold. In these examples, it may not be valuable to introduce an error to prevent only one non-target error. In some examples, the probability may be a probability of affecting two or more non-target values. In these examples, introducing a correctable error to prevent multiple errors may be valuable. In still other examples, the system may distinguish between correctable errors that are introduced by writing the data and uncorrectable errors. That is, if a non-target data unit were to experience an uncorrectable ECC error because of the data write, then it would be valuable to introduce a correctable ECC error in the data to be written to prevent the uncorrectable ECC of a non-target data value. Thus, the system may utilize one or more rules (e.g., if-then statements) to determine when to modify the data value before writing. For example:

IF the probability of a non-target data unit experiencing an uncorrectable error is greater than a first threshold AND the probability of the non-target data unit experiencing an uncorrectable error is reduced below a second threshold by introducing a correctable error on the data-to-be-written THEN introduce the correctable error on the data-to-be-written ELSE IF the probability of multiple non-target data units experiencing a correctable error is greater than a fourth threshold AND by introducing a correctable error on the data-to-be-written reduces the probability of multiple non-target data units experiencing a correctable error below a fifth threshold THEN introduce the correctable error on the data-to-be written.

In some examples, the value to change the data to may be determined through communication with the value changer 114. For example, value changer 114 may have a table that maps data values to one or more changed data values. The table may be based upon experience that changing a first value to a second value may reduce the probability of interference to data values stored in non-target data units. In some examples, the value changer 114 may provide one or more hypothesis for new values. These new values may be run through the disturbance checker component 110 to determine if the probability for interference is greater or lower than the original value. Probabilities for a series of these values may be calculated and the value that produces the lowest probability for interference may be selected.

In some examples, the ECC applied to the data allows for a set number of bit error corrections per specified unit of data written. In these examples, the values produced by the value changer 114 may only change that many bits to ensure that the ECC error is correctable. In other examples, the number of bit error corrections per specified unit may be lowered from the maximum for the given ECC based upon the condition of the media at the address the data will be written at. For example, if that media location is wearing, has produced ECC errors in the past, or the like, the system may not use the full amount of bit errors that may be corrected in the anticipation that the media may add one or more unintentional errors.

Once the new value is calculated, the disturbance checker component 110 may provide the results to host command control 106, which may instruct the media controller 112 to write the new value to the storage media 104 at the proposed address. When the host 116 wishes to read this value from the address, the host 116 will issue a read command to the storage controller 102. The host command control 106 may command the media controller 112 to read the value at the given address from the storage media 104. The value will then fail the ECC check and may be corrected by the ECC component 108. The corrected value may then be provided to the host 116. If the ECC component 108 cannot correct the error, the host 116 is notified.

Figure 2:
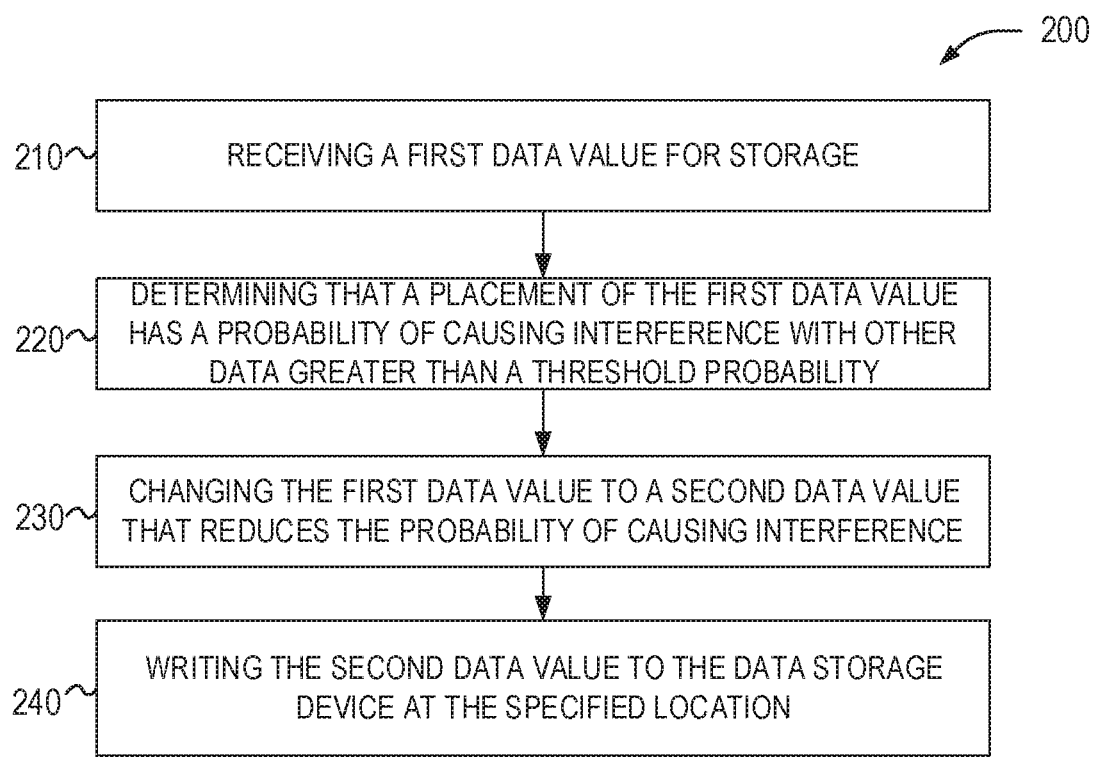
FIG. 2 illustrates a flowchart of a method of storing data in a data storage device according to some examples of the present disclosure.

FIG. 2 illustrates a flowchart of a method 200 of storing data in a data storage device according to some examples of the present disclosure. At operation 210 the memory device may receive a first data value for storage. The data value may be the proposed data value. The memory device may receive the first data value from a host device over a host interface. For example, from a host device over a Peripheral Component Interconnect Express (PCI-E) interface, a Small Computer System Interface (SCSI), a Universal Flash Storage (UFS) interface, and the like. The host device may be a controller on the processor of a computing device of which the memory device is a part of. For example, a processor, a platform controller hub (PCH), a device driver, or the like. The first data value may be received in a write request that requests the memory device write the first data value (the proposed data value) at a proposed memory address. The memory address given by the host may be translated into a physical memory address on the storage medium. For example, a flash translation layer may translate the logical address provided by the host to one or more physical memory addresses. In some examples, this may include determining multiple addresses. For example, a byte of data may map to multiple memory cells or magnetic charges on the disk.

At operation 220, the memory device may determine that placement of the first data value at the proposed location has a probability of causing interference with other non-target data units that is greater than a threshold probability. In some examples, all non-target data units are analyzed, but in other examples, only neighboring data units may be analyzed. For example, the physical memory addresses may have values stored in non-target (e.g., neighboring) data units that have a high read and/or write disturb count and writing the proposed data value may cause one or more of these non-target data units to increase in charge such that it reads a wrong value. In other examples, placing the data at the proposed location may create one or more patterns that causes electrical or magnetic interference to other data. The patterns may be determined using one or more if-then rules that may consider the non-target data units, media state of the non-target data units, the location of the non-target data units relative to the written data, and the like. In other examples, the patterns may be described by one or more data structures and the pattern that would result from writing the proposed data value at the physical address may be compared to a plurality of undesirable patterns. The undesirable patterns may be stored in the memory device. For example, if the request at operation 210 would cause a long run of same-valued data to be stored on a magnetic disk in a small area (i.e. a high density of a same value or a long run of a same data value), it may increase the probability of creating a self-demagnetization field and thus the probability at operation 220 may be above a threshold.

The threshold probability at operation 220 may be a numerical threshold that may be specified by a designer of the memory device. In other examples, the probability at operation 220 may be a yes or no probability—e.g., if the proposed data value being written at the proposed address matches one of the undesirable patterns, the result of operation 220 may be a "yes."

At operation 230, the system may change the first data value to a second data value that reduces the probability of causing interference to one or more data values in non-target data units. For example, the system may change one or more bits of the data value and re-evaluate the changed data value using the methods disclosed for operation 220. The new data value with the lowest probability of causing interference to one or more non-targeted data values may be selected. In some examples, the memory device may only change a number of bits that are correctable using the ECC applied to the first data values prior to changing it to the second data value. In some examples, the memory device may change fewer bits than are correctable using an ECC to ensure that minor disturbances on the media do not cause uncorrectable ECC errors.

At operation 240, the memory device may write the second value to the media of the data storage device at the proposed location. In some examples, the ECC information (e.g., a parity check value, or the like) from the originally proposed value may also be written. For example, the controller may spin the magnetic disks to the proper track and sector and cause application of a magnetic field to write the second value. In other examples, a program voltage is applied to one or more memory cells of flash memory (e.g., NAND or NOR).

Figure 3:
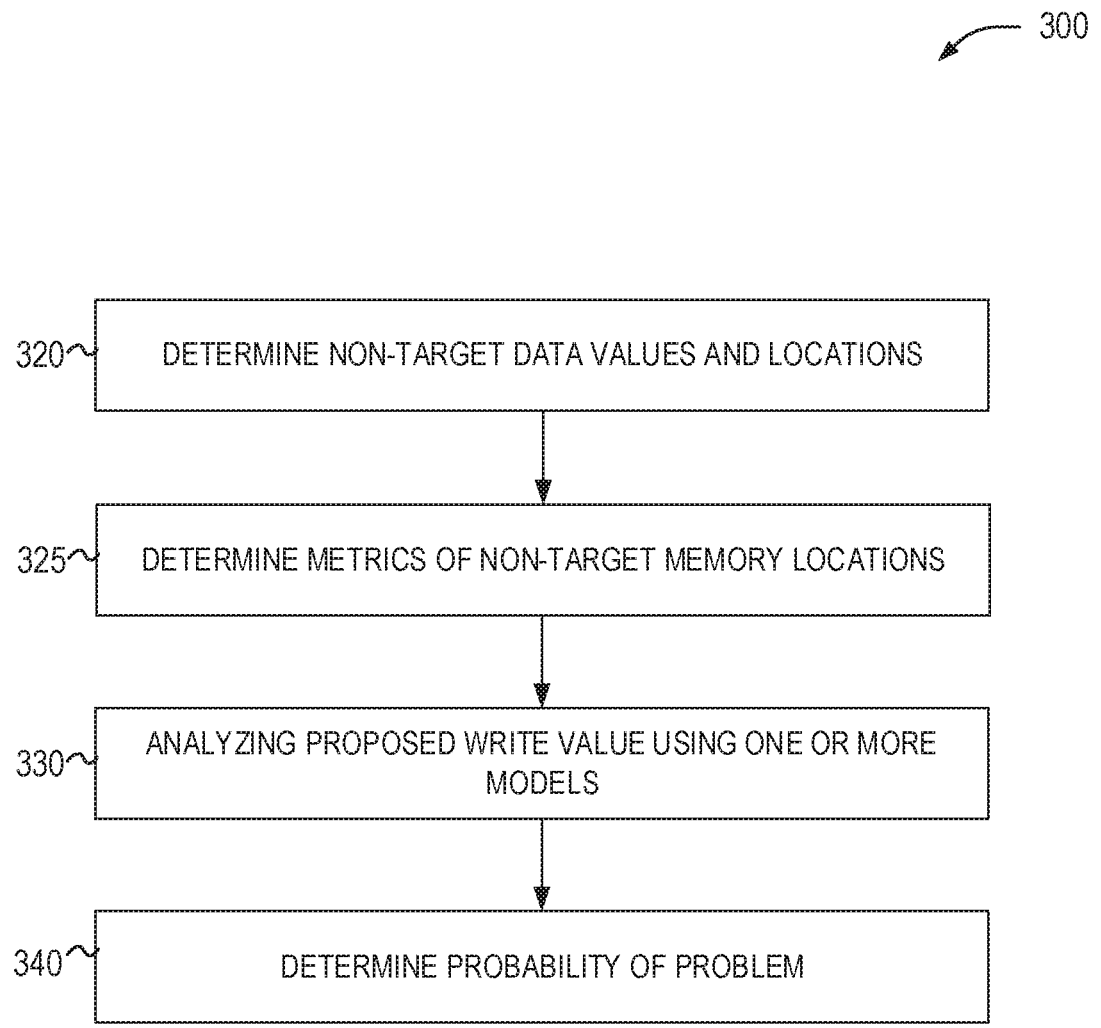
FIG. 3 illustrates a flowchart of a method of determining a probability that the placement of the first data value at an indicated location has a probability of causing interference with other data that is greater than a threshold probability according to some examples of the present disclosure.

FIG. 3 illustrates a flowchart of a method 300 of determining a probability that the placement of the first data value at a proposed location has a probability of causing interference with other data that is greater than a threshold probability according to some examples of the present disclosure. The method 300 may be one example of operation 220 of FIG. 2. At operation 320, the memory device may determine non-target data storage units to the proposed address. In some examples, this may be neighboring data units as defined above. In some examples, this may include non-target data values within a threshold distance on the physical media from the one or more storage units used to store the data value at the requested storage location. For example, data that is physically stored on the media in a location that is adjacent to the requested storage location. For example, a same sector on adjacent tracks, a same track on adjacent sectors, or the like. In examples in which the memory device is a NAND memory device, memory cells that are on adjacent word lines, adjacent page lines, and the like.

At operation 325, in some examples, the memory device may determine metrics of one or more of the non-target data storage units determined in operation 320. For example, one or more of a read-disturb count, a write-disturb count, a number of uncorrectable ECC errors associated with those locations, a write count, a read count, and the like. In some examples, the metrics may be individualized to each data storage unit (e.g., each memory cell, or each bit storage unit on a hard drive), but in other examples, the metrics may be generalized to one or more groups of data storage units. For example, a page of NAND cells, a sector of a magnetic hard disk, or the like.

At operation 330, the memory device may analyze the proposed value using one or more models. In some examples, the models may be if-then-else rules. In some examples, the models may be one or more nested sets of if-then-else rules such as a decision tree. For example, the rules may model placements of data, such as rules specifying a maximum run-length of a particular value, a maximum density of a particular value in a particular area (e.g., within a radius of x data units, there can only be a maximum of y same bit values). In some examples, rules may specify a maximum threshold of reads, writes, or other values for non-target data units before a probability of an error in a non-targeted data unit exceeds a threshold.

In other examples, machine-learned models may be utilized that may take as input the proposed value and the proposed location and information on values in non-target data units and their locations respective to the proposed location. Additionally, the machine-learned models may also use information on the status of the media for the data units making up the proposed location and the non-target data units. For example, a read-disturb counter, write-disturb counter, a number of reads, a number of writes, and the like. The machine-learned model may be trained on a large corpus of historical data writes and may be labelled on whether a subsequent read of non-target data units resulted in an ECC error. The machine-learned model may thus be trained to predict the likelihood of an ECC error. More information on machine-learned models is shown in FIG. 4.

At operation 340, the results of the models may be used to determine whether a probability of a non-target data unit being interfered with by writing the requested value at the requested location is above a threshold. In some examples, at operation 330 a single rule may be evaluated, and the result of the evaluation may be used to determine the probability. For example, a comparison may yield a match between the proposed value at the proposed location, non-target values, and one or more undesirable data patterns. In these examples, finding a match with an undesirable data pattern may cause the result of operation 340 to return true—that the probability is above a threshold. In some examples, at operation 330 multiple rules may be evaluated. For example, the system may return that the probability is above a threshold that a non-target data unit may be interfered with by the placement of the requested value at the proposed location if one or more rules return true, or if a combination of rules returns true as specified by one or more Boolean logical connectors between rules (e.g., AND, OR, NOR, XOR). In some examples, rather than use Boolean logical rules, each of multiple rules may produce a sub score that may be weighted and combined to produce a value, which, if the value exceeds a threshold, the system indicates that the placement of the proposed value in the proposed location may cause interference to data in non-targeted data units. In other examples, for machine-learned models, operation 340 utilizes the results of the machine-learned model.

Figure 4:
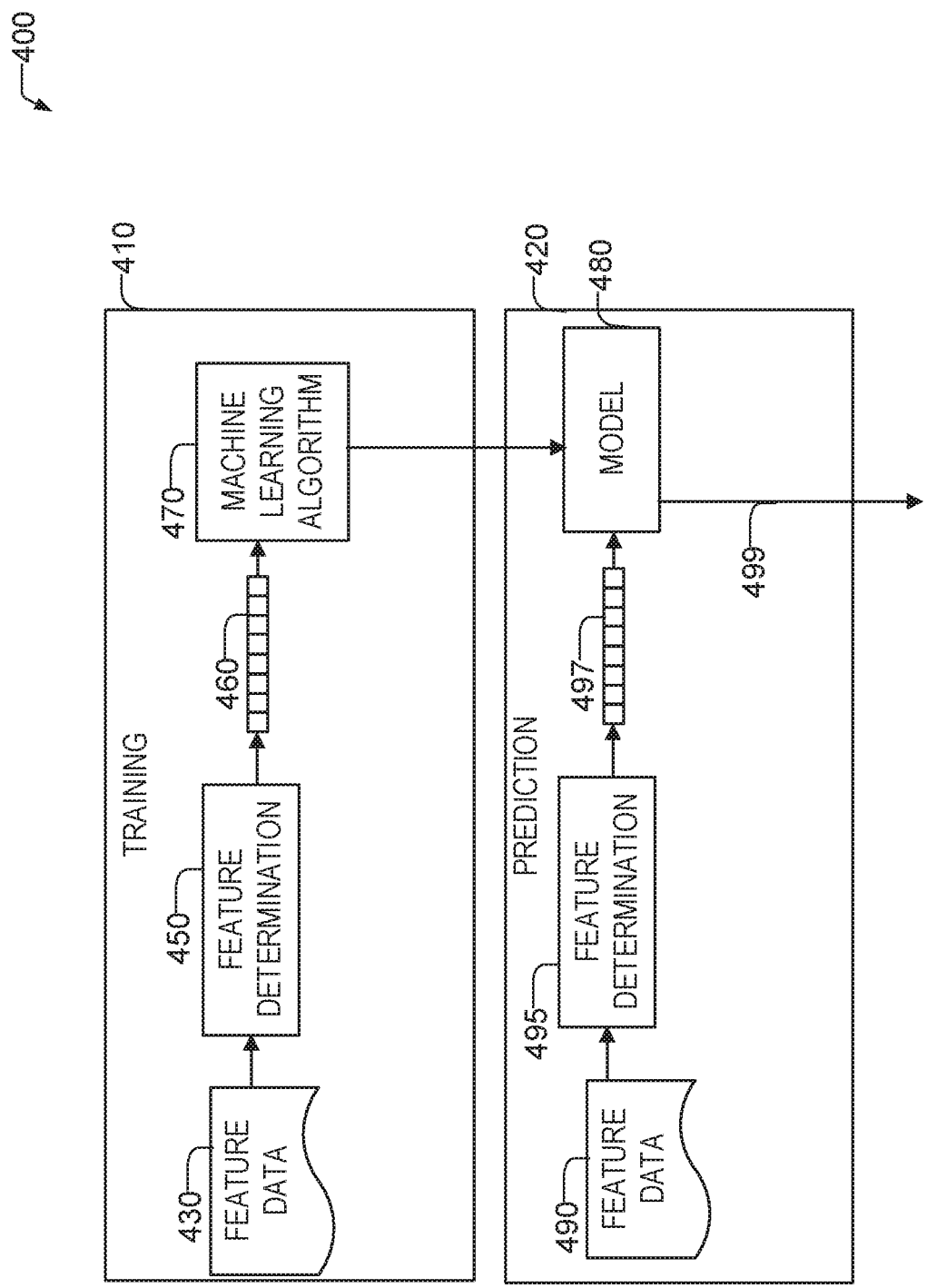
FIG. 4 illustrates an example machine learning module according to some examples of the present disclosure.

FIG. 4 illustrates an example machine learning module 400 according to some examples of the present disclosure. The machine learning module 400 may be implemented in whole or in part by the storage controller 102. In some examples, the training module 410 may be implemented by a different device than the prediction module 420. In these examples, the model 480 may be created on a first machine and then sent to a second machine.

Machine learning module 400 utilizes a training module 410 and a prediction module 420. Training module 410 inputs feature data 430 into feature determination module 450. Feature determination module 450 determines one or more features for feature vector 460 from the feature data 430. Features chosen for inclusion in the feature vector 460 may be all the feature data 430 or in some examples, may be a subset of all the feature data 430. In examples in which the features chosen for the feature vector 460 are a subset of the feature data 430, a predetermined list of which feature data 430 is included in the feature vector may be utilized. The feature vector 460 may be utilized (along with any applicable labels) by the machine learning algorithm 470 to produce a model 480.

In the prediction module 420, the current feature data 490 of the user may be input to the feature determination module 495. Feature determination module 495 may determine the same set of features or a different set of features as feature determination module 450. In some examples, feature determination module 450 and 495 are the same modules or different instances of the same module. Feature determination module 495 produces feature vector 497, which are input into the model 480 to produce results 499.

The training module 410 may operate in an offline manner to train the model 480. The prediction module 420, however, may be designed to operate in an online manner. It should be noted that the model 480 may be periodically updated via additional training and/or user feedback. The machine learning algorithm 470 may be selected from among many different potential supervised or unsupervised machine learning algorithms. Examples of supervised learning algorithms include artificial neural networks, convolutional neural networks, Bayesian networks, instance-based learning, support vector machines, decision trees (e.g., Iterative Dichotomiser 3, C4.5, Classification and Regression Tree (CART), Chi-squared Automatic Interaction Detector (CHAID), and the like), random forests, linear classifiers, quadratic classifiers, k-nearest neighbor, linear regression, logistic regression, and hidden Markov models. Examples of unsupervised learning algorithms include expectation-maximization algorithms, vector quantization, and information bottleneck method. Unsupervised models may not have a training module 410 or may not utilize labels on feature data 430.

The model 480 may be utilized in some examples to determine whether placement of the proposed value at the proposed location is likely to cause errors to values in non-target data units. In these examples, the feature data 430 may include historical data storage requests including the proposed value and location as well as one or more of: the non-target data units locations relative to the value and location, information about the data units making up the proposed location and non-target data units (e.g., such as the number of previous writes, erases, reads, read-disturb counters, write-disturb counters, and the like), or the like. The feature data 430 may be labeled with an indication of whether and which non-target data units experienced an ECC error that corresponds to the proposed write. Corresponding to the proposed write may include experiencing an ECC error within a specified number of reads since the proposed write, within a specified amount of time since the proposed write, errors occurring within a specified amount of additional write requests, or the like. Feature data 490 includes the current proposed value and location as well as one or more of: the non-target data units locations relative to the value and location, information about the data units making up the proposed location and non-target data units (e.g., such as the number of previous writes, erases, reads, read-disturb counters, write-disturb counters, and the like), or the like. The model 480 may provide a probability that the proposed write may introduce one or more errors into the data or may be an indication of whether one or more errors are likely to be introduced.

In some examples, the system modifies the proposed value if the probability of a single error being introduced in a single non-target data unit exceeds a threshold. In other examples, the system may modify the proposed value only if the probability of multiple errors being introduced in multiple non-target data units exceeds a threshold or if the single error in the single non-target data unit would be an uncorrectable ECC error.

Figure 5:
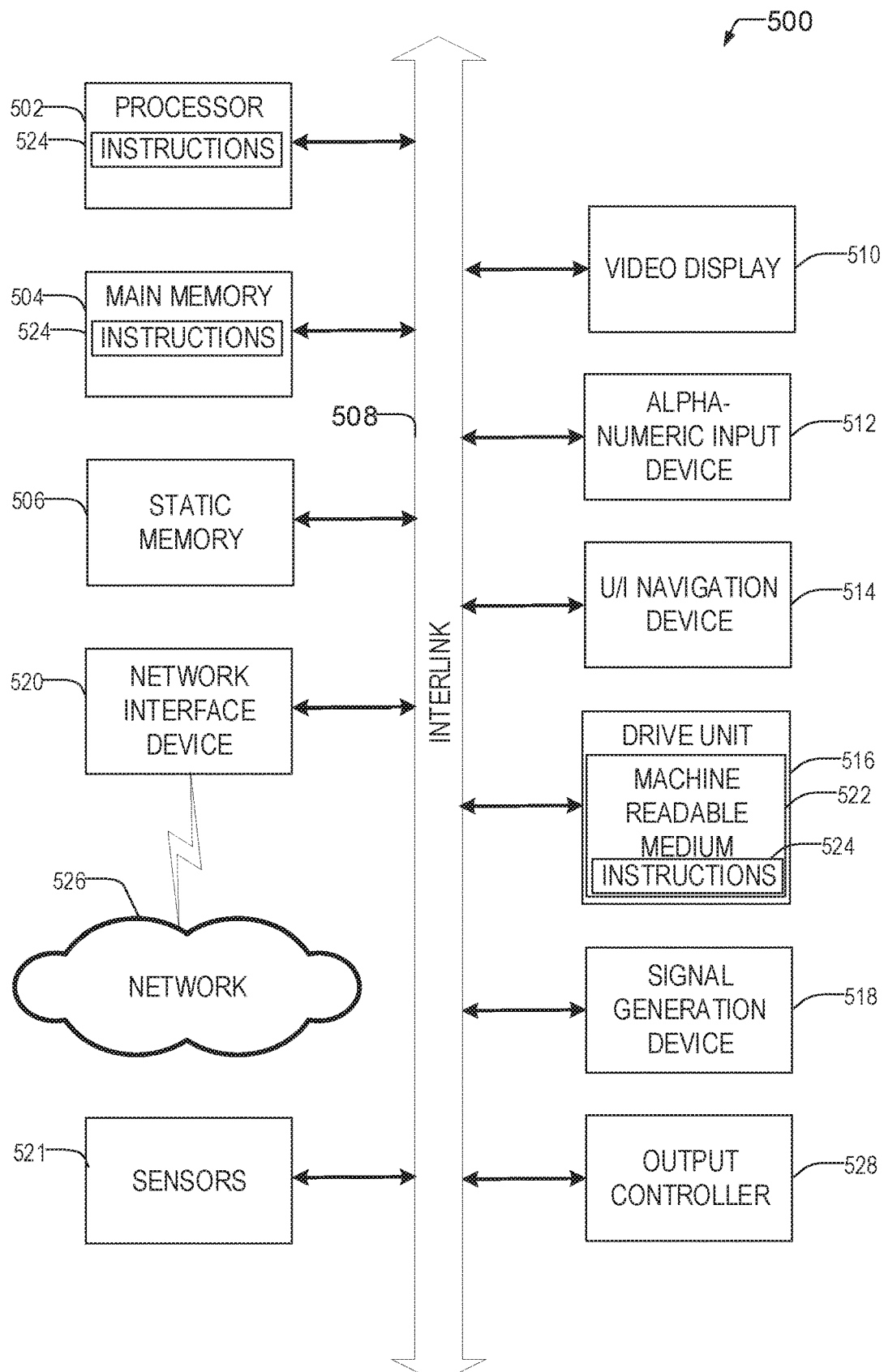
FIG. 5 is a block diagram illustrating an example of a machine upon which one or more embodiments may be implemented.

FIG. 5 illustrates a block diagram of an example machine 500 that may implement any one or more of the techniques (e.g., methodologies) discussed herein. In some examples, the host device may include the machine 500 and the memory device may be the main memory 504, static memory 506, drive unit 516, or the like. The memory device may also include one or more of the components of FIG. 5, such as processor 502, main memory 504 (including instructions 524), and the like. In alternative embodiments, the machine 500 may operate as a standalone device or may be connected (e.g., networked) to other machines. Machine 500 may implement the data storage device 100, a device implementing host 116, and perform the methods of FIGS. 2 and 3 and implement one or more of the machine-learning modules of FIG. 4. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a memory device, a personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Machine (e.g., computer system) 500 may include a hardware processor 502 (e.g., a central processing unit (CPU), a graphics processing unit (GPU), a hardware processor core, or any combination thereof), a main memory 504 and a static memory 506, some or all of which may communicate with each other via an interlink (e.g., bus) 508. The machine 500 may further include a display unit 510, an alphanumeric input device 512 (e.g., a keyboard), and a user interface (UI) navigation device 514 (e.g., a mouse). In an example, the display unit 510, input device 512 and UI navigation device 514 may be a touch screen display. The machine 500 may additionally include a storage device (e.g., drive unit) 516, a signal generation device 518 (e.g., a speaker), a network interface device 520, and one or more sensors 521, such as a global positioning system (GPS) sensor, compass, accelerometer, or other sensor. The machine 500 may include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 516 may include a machine readable medium 522 on which is stored one or more sets of data structures or instructions 524 (e.g., software) embodying or utilized by any one or more of the techniques or functions described herein. The instructions 524 may also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 516 may constitute machine readable media.

While the machine readable medium 522 is illustrated as a single medium, the term "machine readable medium" may include a single medium or multiple media (e.g., a centralized or distributed database, and/or associated caches and servers) configured to store the one or more instructions 524.

The term "machine readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); Solid State Drives (SSD); and CD-ROM and DVD-ROM disks. In some examples, machine readable media may include non-transitory machine readable media. In some examples, machine readable media may include machine readable media that is not a transitory propagating signal.

The instructions 524 may further be transmitted or received over a communications network 526 using a transmission medium via the network interface device 520. The Machine 500 may communicate with one or more other machines utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. In some examples, the network interface device 520 may wirelessly communicate using Multiple User MIMO techniques.

OTHER NOTES AND EXAMPLES

Example 1 is a method for storing data, the method comprising: receiving a first data value for storage at a specified location on a data storage device, the first data value having an error correction code applied; determining that a placement of the first data value at the specified location has a probability of causing interference with other data stored at other locations on the data storage device, the probability being greater than a threshold probability; changing the first data value to a second data value, the second data value reducing the probability of causing interference with the other data stored at the other locations; and writing the second data value to the data storage device at the specified location.

In Example 2, the subject matter of Example 1 includes, wherein the data storage device is a magnetic storage device.

In Example 3, the subject matter of Example 2 includes, wherein the probability of causing interference is a probability of causing interference due to writing of the first data value at the specified location that would create a region of the data storage device that has a constant value of magnetization field strength.

In Example 4, the subject matter of Examples 1-3 includes, wherein the data storage device comprises an array of NAND memory cells.

In Example 5, the subject matter of Example 4 includes, wherein the probability of causing interference is a probability of causing interference due to a program disturb.

In Example 6, the subject matter of Examples 1-5 includes, wherein the method further comprises: tracking NAND cells affected by program disturb; and wherein determining that the placement of the first data value at the specified location will have the probability of causing interference with other data stored at other locations on the data storage device comprises determining that placement of the data at the specified location and with the first data value will cause a voltage to be applied to the other data stored at other locations.

In Example 7, the subject matter of Examples 1-6 includes, wherein the method further comprises: receiving a read request for the specified location; reading a value at the specified location, the value being the second value; and correcting the second value to the first value using an error correction code.

Example 8 is a data storage device comprising: a processor; a memory, storing instructions, which when executed by the processor, causes the processor to perform operations comprising: receiving a first data value for storage at a specified location on the data storage device, the first data value having an error correction code applied; determining that a placement of the first data value at the specified location has a probability of causing interference with other data stored at other locations on the data storage device, the probability being greater than a threshold probability; changing the first data value to a second data value, the second data value reducing the probability of causing interference with the other data stored at the other locations; and writing the second data value to the data storage device at the specified location.

In Example 9, the subject matter of Example 8 includes, wherein the data storage device is a magnetic storage device.

In Example 10, the subject matter of Example 9 includes, wherein the probability of causing interference is a probability of causing interference due to writing of the first data value at the specified location that would create a region of the data storage device that has a constant value of magnetization field strength.

In Example 11, the subject matter of Examples 8-10 includes, wherein the data storage device comprises an array of NAND memory cells.

In Example 12, the subject matter of Example 11 includes, wherein the probability of causing interference is a probability of causing interference due to a program disturb.

In Example 13, the subject matter of Examples 8-12 includes, wherein the operations further comprise: tracking NAND cells affected by program disturb; and wherein the operations of determining that the placement of the first data value at the specified location will have the probability of causing interference with other data stored at other locations on the data storage device comprises determining that placement of the data at the specified location and with the first data value will cause a voltage to be applied to the other data stored at other locations.

In Example 14, the subject matter of Examples 8-13 includes, wherein the operations further comprise: receiving a read request for the specified location; reading a value at the specified location, the value being the second value; and correcting the second value to the first value using an error correction code.

Example 15 is a machine-readable medium, storing instructions, which when executed by a controller of a data storage device, cause the controller to perform operations comprising: receiving a first data value for storage at a specified location on the data storage device, the first data value having an error correction code applied; determining that a placement of the first data value at the specified location has a probability of causing interference with other data stored at other locations on the data storage device, the probability being greater than a threshold probability; changing the first data value to a second data value, the second data value reducing the probability of causing interference with the other data stored at the other locations; and writing the second data value to the data storage device at the specified location.

In Example 16, the subject matter of Example 15 includes, wherein the data storage device is a magnetic storage device.

In Example 17, the subject matter of Example 16 includes, wherein the probability of causing interference is a probability of causing interference due to writing of the first data value at the specified location that would create a region of the data storage device that has a constant value of magnetization field strength.

In Example 18, the subject matter of Examples 15-17 includes, wherein the data storage device comprises an array of NAND memory cells.

In Example 19, the subject matter of Example 18 includes, wherein the probability of causing interference is a probability of causing interference due to a program disturb.

In Example 20, the subject matter of Examples 15-19 includes, wherein the operations further comprise: tracking NAND cells affected by program disturb; and wherein the operations of determining that the placement of the first data value at the specified location will have the probability of causing interference with other data stored at other locations on the data storage device comprises determining that placement of the data at the specified location and with the first data value will cause a voltage to be applied to the other data stored at other locations.

In Example 21, the subject matter of Examples 15-20 includes, wherein the operations further comprise: receiving a read request for the specified location; reading a value at the specified location, the value being the second value; and correcting the second value to the first value using an error correction code.

Example 22 is a data storage device comprising: means for receiving a first data value for storage at a specified location on the data storage device, the first data value having an error correction code applied; means for determining that a placement of the first data value at the specified location has a probability of causing interference with other data stored at other locations on the data storage device, the probability being greater than a threshold probability; means for changing the first data value to a second data value, the second data value reducing the probability of causing interference with the other data stored at the other locations; and means for writing the second data value to the data storage device at the specified location.

In Example 23, the subject matter of Example 22 includes, wherein the data storage device is a magnetic storage device.

In Example 24, the subject matter of Example 23 includes, wherein the probability of causing interference is a probability of causing interference due to writing of the first data value at the specified location that would create a region of the data storage device that has a constant value of magnetization field strength.

In Example 25, the subject matter of Examples 22-24 includes, wherein the data storage device comprises an array of NAND memory cells.

In Example 26, the subject matter of Example 25 includes, wherein the probability of causing interference is a probability of causing interference due to a program disturb.

In Example 27, the subject matter of Examples 22-26 includes, means for tracking NAND cells affected by program disturb; and wherein the means for determining that the placement of the first data value at the specified location will have the probability of causing interference with other data stored at other locations on the data storage device comprises means for determining that placement of the data at the specified location and with the first data value will cause a voltage to be applied to the other data stored at other locations.

In Example 28, the subject matter of Examples 22-27 includes, wherein the data storage device further comprises: means for receiving a read request for the specified location; means for reading a value at the specified location, the value being the second value; and means for correcting the second value to the first value using an error correction code.

Example 29 is at least one machine-readable medium including instructions that, when executed by processing circuitry, cause the processing circuitry to perform operations to implement of any of Examples 1-28.

Example 30 is an apparatus comprising means to implement of any of Examples 1-28.

Example 31 is a system to implement of any of Examples 1-28.

Example 32 is a method to implement of any of Examples 1-28.

What is claimed is:

1. A method for storing data, the method comprising:
receiving a proposed data value for storage at a target location on a data storage device, the proposed data value having an error correction code applied;
prior to writing the proposed data value at the target location:
determining, based upon the proposed data value and a non-target data value stored in a non-target location on the data storage device, that writing of the proposed data value to the target location has a first probability that exceeds a threshold probability of changing the non-target data value stored at the non-target location on the data storage device or changing a second non-target data value at a second non-target location;
selecting a second data value that has a second probability of causing interference with the non-target data value stored at the non-target location or the second non-target data value at the second non-target location, the second probability less than the first probability, the second data value selected based upon the proposed data value and the non-target data value stored at the non-target location; and
changing the proposed data value to the second data value; and
writing the second data value to the data storage device at the target location.

2. The method of claim 1, wherein the data storage device is a magnetic storage device.

3. The method of claim 2, wherein the first probability is calculated based upon a probability that writing the proposed data value at the target location would create a region of the data storage device that has a constant value of magnetization field strength.

4. The method of claim 1, wherein the data storage device comprises an array of NAND memory cells.

5. The method of claim 4, wherein the first probability is calculated based upon a program disturb produced by writing the proposed data value to the target location.

6. The method of claim 1, wherein the method further comprises:
receiving a read request for the target location;
reading a value at the target location, the value being the second data value; and
correcting the second data value to the proposed data value using the error correction code.

7. A data storage device comprising:
a processor;
a memory, storing instructions, which when executed by the processor, causes the processor to perform operations comprising:
receiving a proposed data value for storage at a target location on a data storage device, the proposed data value having an error correction code applied;
prior to writing the proposed data value at the target location:
determining, based upon the proposed data value and a non-target data value stored in a non-target location on the data storage device, that writing of the proposed data value to the target location has a first probability that exceeds a threshold probability of changing the non-target data value stored at the non-target location on the data storage device or changing a second non-target data value at a second non-target location;
selecting a second data value that has a second probability of causing interference with the non-target data value stored at the non-target location or the second non-target data value at the second non-target location, the second probability less than the first probability, the second data value selected based upon the proposed data value and the non-target data value stored at the non-target location; and
changing the proposed data value to the second data value; and
writing the second data value to the data storage device at the target location.

8. The data storage device of claim 7, wherein the data storage device is a magnetic storage device.

9. The data storage device of claim 8, wherein the first probability is calculated based upon a probability that writing the proposed data value at the target location would create a region of the data storage device that has a constant value of magnetization field strength.

10. The data storage device of claim 7, wherein the data storage device comprises an array of NAND memory cells.

11. The data storage device of claim 10, wherein the first probability is calculated based upon a program disturb produced by writing the proposed data value to the target location.

12. The data storage device of claim 7, wherein the operations further comprise:
receiving a read request for the target location;
reading a value at the target location, the value being the second data value; and
correcting the second data value to the proposed data value using the error correction code.

13. A data storage device comprising:
means for receiving a proposed data value for storage at a target location on a data storage device, the proposed data value having an error correction code applied;
prior to writing the proposed data value at the target location:
means for determining, based upon the proposed data value and a non-target data value stored in a non-target location on the data storage device, that writing of the proposed data value to the target location has a first probability that exceeds a threshold probability of changing the non-target data value stored at the non-target location on the data storage device or changing a second non-target data value at a second non-target location;
means for selecting a second data value that has a second probability of causing interference with the non-target data value stored at the non-target location or the second non-target data value at the second non-target location, the second probability less than the first probability, the second data value selected based upon the proposed data value and the non-target data value stored at the non-target location; and
means for changing the proposed data value to the second data value; and
means for writing the second data value to the data storage device at the target location.

14. The data storage device of claim 13, wherein the data storage device is a magnetic storage device.

15. The data storage device of claim 14, wherein the first probability is calculated based upon a probability that writing the proposed data value at the target location would create a region of the data storage device that has a constant value of magnetization field strength.

16. The data storage device of claim 13, wherein the data storage device comprises an array of NAND memory cells.

17. The data storage device of claim 16, wherein the first probability is calculated based upon a program disturb produced by writing the proposed data value to the target location.

* * * * *